(12) United States Patent
Imada et al.

(10) Patent No.: US 6,748,758 B2
(45) Date of Patent: Jun. 15, 2004

(54) COOLING DEVICE, METHOD OF MANUFACTURING THE SAME AND PORTABLE EQUIPMENT

(75) Inventors: Katsumi Imada, Nara (JP); Atsushi Komatsu, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/454,965

(22) Filed: Jun. 5, 2003

(65) Prior Publication Data

US 2004/0000157 A1 Jan. 1, 2004

(30) Foreign Application Priority Data

Jun. 26, 2002 (JP) .................................. 2002-186706

(51) Int. Cl.[7] .............................................. F25D 23/12
(52) U.S. Cl. .................... 62/259.2; 62/118; 165/104.28
(58) Field of Search .............................. 62/118, 259.2; 165/104.28, 104.33; 361/699

(56) References Cited

U.S. PATENT DOCUMENTS 4,618,266 A * 10/1986 Feller ........................... 374/41
5,764,483 A    6/1998 Ohashi et al.

FOREIGN PATENT DOCUMENTS

| JP | 2001-24372 |   | 1/2001 |
| JP | 2002-494102 | * | 4/2002 |
| JP | 2002-314279 |   | 10/2002 |

* cited by examiner

Primary Examiner—Melvin Jones
(74) Attorney, Agent, or Firm—Merchant & Gould, P.C.

(57) ABSTRACT

In a cooling device including a pump, a heat absorber, a heat radiator, a flow channel that allows communication between interiors thereof and forms a closed-loop circulating cycle therebetween, and a liquid refrigerant that circulates in the flow channel, a volume of a gas generated in the liquid refrigerant owing to temperature change within an operating temperature range of the liquid refrigerant is smaller than a volume of a sphere that is inscribed in a cross-section of the flow channel. In this way, even when the solubility changes due to rapid heating or cooling of the liquid refrigerant, no gas is generated in the liquid refrigerant. Thus, it is possible to provide a cooling device that maintains an excellent cooling effect even after a long time use.

10 Claims, 12 Drawing Sheets

COOLING DEVICE, METHOD OF MANUFACTURING THE SAME AND PORTABLE EQUIPMENT

BACKGROUND OF THE INVENTION

1. Field of the Invention

The present invention relates to a cooling device using a liquid refrigerant and a method for manufacturing the cooling device. The present invention also relates to portable equipment including the cooling device.

2. Description of Related Art

A conventionally known cooling device using a refrigerant is described by JP 2001-24372 A.

FIG. 17 is a schematic perspective view showing how elements of a cooling device are arranged in a conventional notebook personal computer (in the following, referred to as a "notebook PC") in which the cooling device is incorporated.

In FIG. 17, numeral 101 denotes a housing of the notebook PC, numeral 102 denotes a heat generator such as a central processing unit (CPU), numeral 104 denotes a heat absorber, numeral 103 denotes a heat-transfer pad arranged between the heat generator 102 and the heat absorber 104, numeral 105 denotes a pump, and numeral 106 denotes a heat radiator. Numeral 107 denotes a display portion of the notebook PC, and numeral 108 denotes a flow channel that allows communication between the interiors of the heat absorber 104, the pump 105 and the heat radiator 106. Inside the flow channel 108 is filled with a water-based or fluorocarbon-based liquid refrigerant.

Next, the operation of this cooling device will be described.

When the notebook PC is used, the pump 105 is powered and activated so as to send out the liquid refrigerant by pressure, whereby the liquid refrigerant circulates through a closed-loop circulating cycle from the pump 105, the heat absorber 104, the heat radiator 106 to the pump 105, which are connected via the flow channel 108. Thus, the liquid refrigerant pushed out from the pump 105 absorbs heat from the heat generator 102 in the heat absorber 104, moves to the heat radiator 106 to radiate the heat and be cooled down again and then returns to the pump 105. By repeating this operation, the heat generated in the notebook PC is radiated outward.

When this cooling device is used for a long time, the liquid refrigerant is heated and cooled, so that a gas (bubbles) is generated in the device. In particular, considerable gas generation occurs inside the heat absorber 104. Since the generated gas blocks the flow channel in the heat absorber 104, a channel resistance increases considerably, thus deteriorating flow rate characteristics of the pump 105. As a result, the flow velocity of the liquid refrigerant drops, causing a problem that a cooling power deteriorates.

Furthermore, inside the heat absorber 104, the formation of a gas layer between an inner wall of the heat absorber 104 and the liquid refrigerant lowers heat conductivity. Consequently, there has been a problem that lowering heat absorbing power of the heat absorber 104 deteriorates the cooling power of the cooling device.

In addition, since not only the liquid refrigerant but also the generated gas flows into other devices, for example, the pump 105, the performance of the pump 105 declines, leading to a problem that the cooling power deteriorates.

SUMMARY OF THE INVENTION

It is an object of the present invention to solve these problems and to provide a cooling device that maintains an excellent cooling effect even after a long time use, and a method for manufacturing the cooling device. It is a further object of the present invention to provide portable equipment that achieves an improvement in performance owing to a stabilized cooling power.

In order to achieve the above-mentioned objects, the present invention has the following configurations.

A first cooling device according to the present invention includes a pump, a heat absorber, a heat radiator, a flow channel that allows communication between interiors of the pump, the heat absorber and the heat radiator and forms a closed-loop circulating cycle therebetween, and a liquid refrigerant that circulates in the flow channel. A volume of a gas generated in the liquid refrigerant owing to temperature change within an operating temperature range of the liquid refrigerant is smaller than a volume of a sphere that is inscribed in a cross-section of the flow channel.

A second cooling device according to the present invention includes a pump, a heat absorber, a heat radiator, a flow channel that allows communication between interiors of the pump, the heat absorber and the heat radiator and forms a closed-loop circulating cycle therebetween, and a liquid refrigerant that circulates in the flow channel. A difference between a product described below and an amount of a gas dissolved in the liquid refrigerant in a state where no gas is generated is smaller than a volume of a sphere that is inscribed in a minimal cross-section of the flow channel. The product is a product of a minimal solubility of the gas in the liquid refrigerant within an operating temperature range of the liquid refrigerant and a total capacity (volume) of the flow channel.

A first method for manufacturing a cooling device according to the present invention is a method for manufacturing a cooling device including a pump, a heat absorber, a heat radiator, a flow channel that allows communication between interiors of the pump, the heat absorber and the heat radiator and forms a closed-loop circulating cycle therebetween, and a liquid refrigerant that circulates in the flow channel. The method includes sealing the liquid refrigerant in the flow channel while maintaining an atmosphere at a temperature at which a gas solubility in the liquid refrigerant takes on a minimal value within an operating temperature range of the liquid refrigerant or is smaller than the minimal value.

A second method for manufacturing a cooling device according to the present invention is a method for manufacturing a cooling device including a pump, a heat absorber, a heat radiator, a flow channel that allows communication between interiors of the pump, the heat absorber and the heat radiator and forms a closed-loop circulating cycle therebetween, and a liquid refrigerant that circulates in the flow channel. The method includes sealing the liquid refrigerant in the flow channel under an atmosphere decompressed so that a gas solubility in the liquid refrigerant at a temperature of an atmosphere at the time of sealing the liquid refrigerant in the flow channel is smaller than a minimal value of the gas solubility under an atmospheric pressure within an operating temperature range of the liquid refrigerant.

According to the first and second cooling devices and the first and second manufacturing methods of the present invention described above, even when the solubility changes due to rapid heating or cooling of the liquid refrigerant, no gas is generated. Thus, it is possible to prevent the cooling power from deteriorating due to the deterioration in flow rate characteristics of the pump occurring because the gas generated after a long time use blocks the flow channel, the lowering of heat conductivity caused by adhesion of the gas to the inner wall of the flow channel and the decline in the pump performance occurring because the generated gas flows into the pump. As a result, a cooling device that maintains an excellent cooling efficiency even after a long time use can be provided.

DESCRIPTION OF THE PREFERRED EMBODIMENTS

Hereinafter, the present invention will be described in detail by way of preferred embodiments.
First Embodiment The following is a description of a first embodiment of the present invention, with reference to the accompanying drawings.

Figure 1:
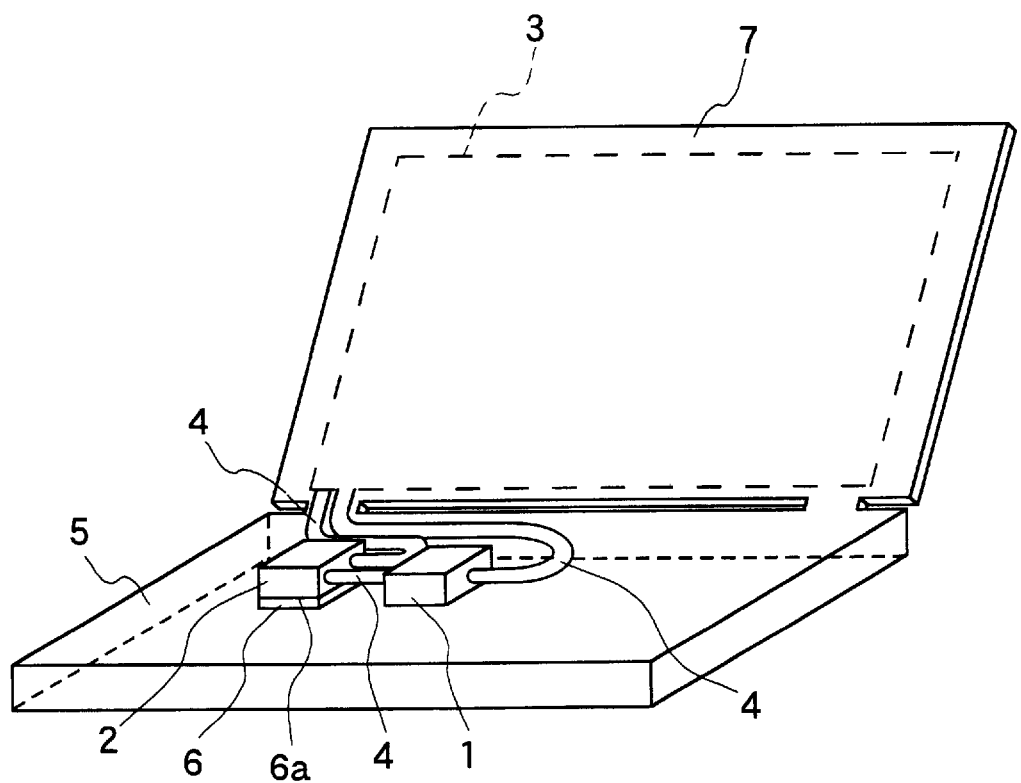
FIG. 1 is a schematic perspective view showing an example of a notebook PC in which a cooling device in a first embodiment of the present invention is incorporated.
Figure 2:
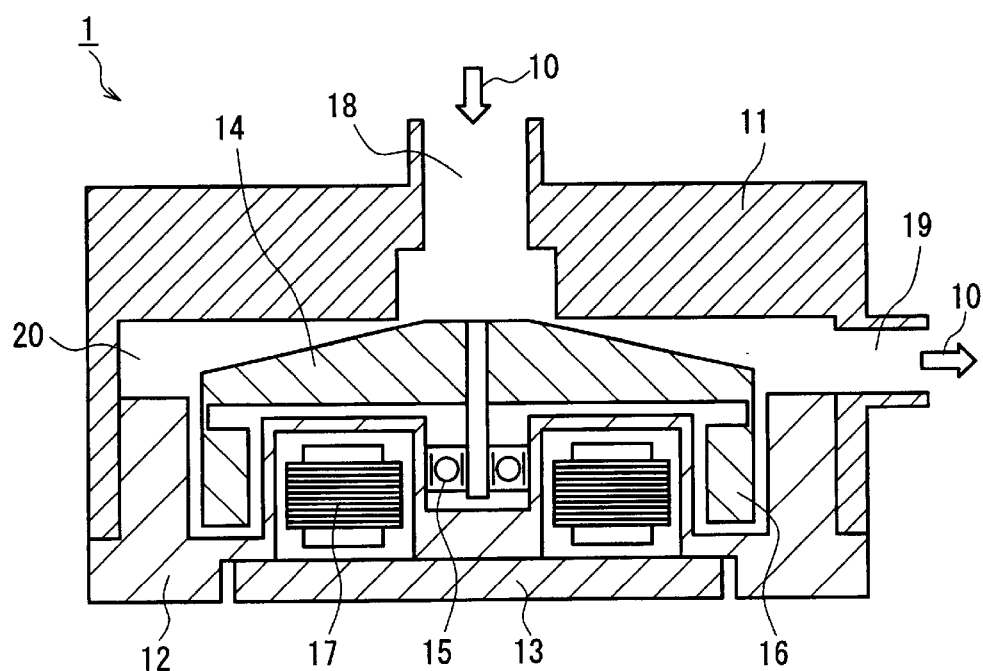
FIG. 2 is a sectional view showing an example of a pump used in the cooling device of the first embodiment of the present invention.
Figure 3A:
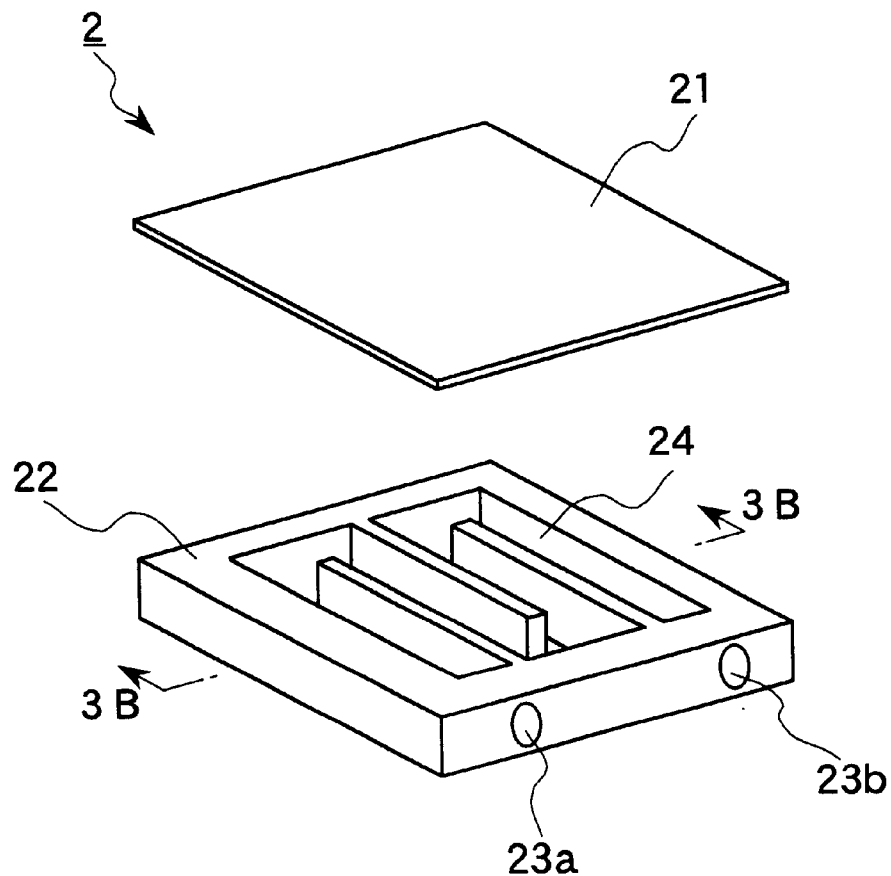
FIG. 3A is an exploded perspective view showing an example of a heat absorber used in the cooling device of the first embodiment of the present invention.
Figure 3B:
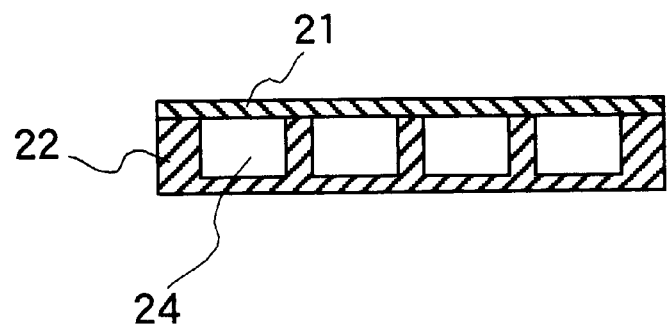
FIG. 3B is a sectional view, taken along line 3B—3B in FIG. 3A and seen from an arrow direction, showing the heat absorber used in the cooling device of the first embodiment of the present invention.
Figure 4:
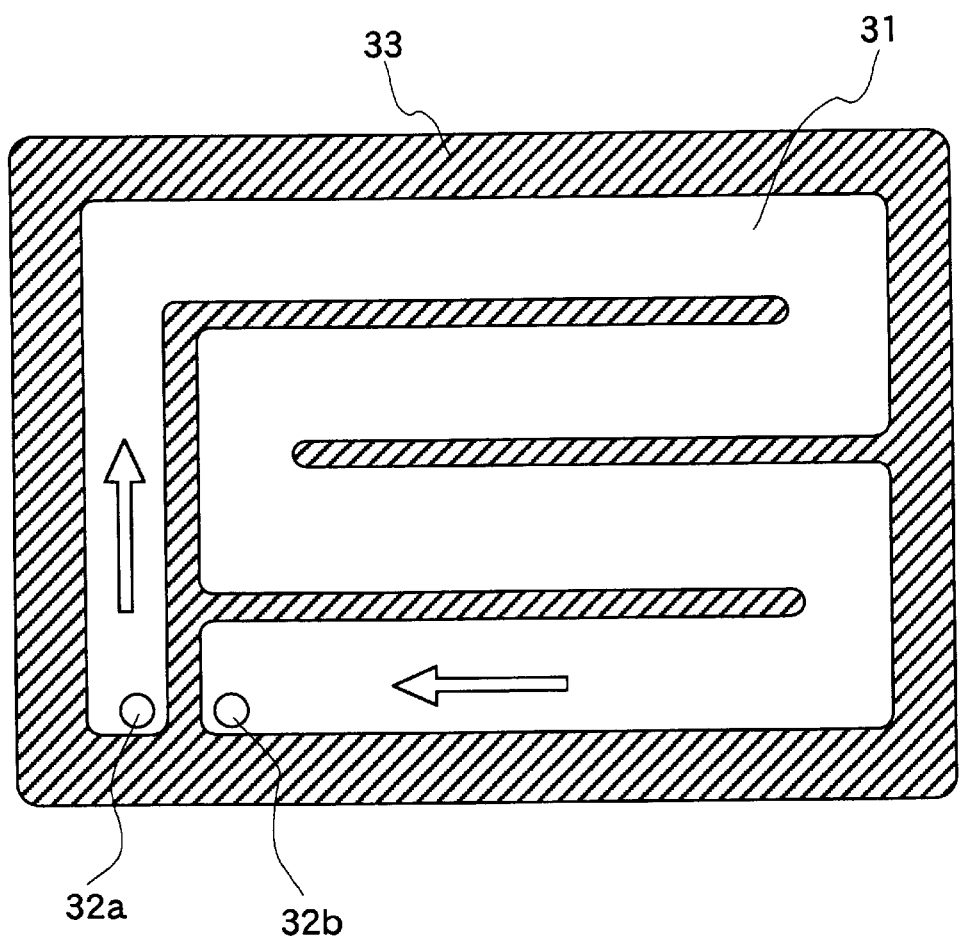
FIG. 4 is a plan sectional view showing an example of an inner flow channel of a heat radiator used in the cooling device of the first embodiment of the present invention.

FIG. 1 is a schematic perspective view showing an example of a notebook PC in which a cooling device of the first embodiment of the present invention is incorporated. FIG. 2 is a sectional view showing an example of a pump used in the cooling device of the first embodiment of the present invention. FIG. 3A is an exploded perspective view showing an example of a heat absorber used in the cooling device of the first embodiment of the present invention. FIG. 3B is a sectional view, taken along line 3B—3B in FIG. 3A and seen from an arrow direction, showing the heat absorber used in the cooling device of the first embodiment of the present invention. FIG. 4 is a plan sectional view showing an example of an inner flow channel of a heat radiator used in the cooling device of the first embodiment of the present invention.

In FIG. 1, numeral 1 denotes a pump, numeral 2 denotes a heat absorber, numeral 3 denotes a heat radiator, and numeral 4 denotes a flow channel that allows communication between the interiors of the pump 1, the heat absorber 2 and the heat radiator 3 and forms a closed-loop circulating cycle from the pump 1 through the heat absorber 2, the heat radiator 3 to the pump 1. Numeral 5 denotes a housing of the notebook PC, numeral 6 denotes a heat generator such as a CPU, numeral 6a denotes a heat-transfer pad arranged between the heat generator 6 and the heat absorber 2, and numeral 7 denotes a display portion of the notebook PC. Inside the flow channel 4 forming the closed-loop circulating cycle from the pump 1, the heat absorber 2, the heat radiator 3 to the pump 1 is filled with a liquid refrigerant. The liquid refrigerant is out of contact with an outside air. The heat absorber 2 closely contacts the heat generator 6 such as the CPU via the heat-transfer pad 6a, whereby the heat from the heat generator 6 is transferred to the heat absorber 2 efficiently. The heat of the heat generator 6 is absorbed in the heat absorber 2 and further transmitted to the liquid refrigerant in the heat absorber 2. The heated liquid refrigerant is carried by a force of the pump 1, thereby carrying the heat to the heat radiator 3, which is formed on a back surface of the display portion 7, and exhausting the heat from the heat radiator 3 into the air. The resultant liquid refrigerant that has been cooled down is carried again to the heat absorber 2, and then the above-described operations are repeated.

In FIG. 2, which shows a schematic structure of the pump 1, numeral 11 denotes a first casing, numeral 12 denotes a second casing, numeral 13 denotes a third casing, numeral 14 denotes an impeller, numeral 15 denotes a bearing, numeral 16 denotes a rotor, numeral 17 denotes a stator, numeral 18 denotes a suction port, and numeral 19 denotes a discharge port. The impeller 14 is held rotatably by the bearing 15 in a space 20 formed by the first casing 11 and the second casing 12. The suction port 18 is provided along the axis of rotation of the impeller 14, whereas the discharge port 19 is provided in a radial direction of the impeller 14. Both of the suction port 18 and the discharge port 19 are connected to the space 20. The rotor 16 formed of a permanent magnet is provided on a periphery of the impeller 14. The stator 17 formed of a coil is held in a space formed by the second casing 12 and the third casing 13 so as to face the rotor 16. This pump is a general centrifugal pump that forms a liquid refrigerant flow utilizing a centrifugal force. By passing an electric current through the coil of the stator 17, an electromagnetic force is generated in the rotor 16, so that a rotary driving force is generated therein. This rotates the impeller 14 to which the rotor 16 is attached. The liquid refrigerant flowing from the suction port 18 into the space 20 is rotated by the rotation of the impeller 14. This generates a centrifugal force to discharge the liquid refrigerant vigorously from the discharge port 19. In this manner, this miniature pump allows the liquid refrigerant to flow in directions indicated by arrows 10.

Although an example of a centrifugal pump as the pump 1 has been illustrated in the above description, a diaphragm type pump or a pump utilizing a piezoelectric effect also may be used. It is needless to say that effects of the present invention can be obtained regardless of the type of pump.

In FIGS. 3A and 3B showing the heat absorber 2, numeral 21 denotes a lid, numeral 22 denotes a heat absorber case, numeral 23a denotes an inflow port, numeral 23b denotes an outflow port, and numeral 24 denotes a flow channel. On one surface of the heat absorber case 22, the flow channel 24 is formed like a groove connecting the inflow port 23a and the outflow port 23b. The surface of the case 22 with a bottom on which the flow channel 24 is formed is sealed by the lid 21 via a sealing layer (not shown). A lateral surface of the case 22 is provided with the inflow port 23a and the outflow port 23b, which are an inlet and an outlet for the liquid refrigerant, respectively. The inflow port 23a and the outflow port 23b are connected to the discharge port 19 of the pump 1 and an inflow port of the heat radiator 3, respectively, via the flow channel 4. The liquid refrigerant is sent by pressure from the inflow port 23a via the flow channel 24 inside the case 22 to the outflow port 23b. When passing through the flow channel 24 in the heat absorber case 22, the liquid refrigerant absorbs the heat from the heat generator 6.

In FIG. 4 illustrating the heat radiator 3, numeral 31 denotes a flow channel, numeral 32a denotes an inflow port, numeral 32b denotes an outflow port, and numeral 33 denotes a case. The flow channel 31 is a single long tube that is formed by bonding and cutting resin sheets, metal sheets or the like and connects a passage between the inflow port 32a and the outflow port 32b. The liquid refrigerant flows in this flow channel 31, whereby the heat of the liquid refrigerant is transferred to the case 33. Then, the case 33 radiates the heat into the surrounding atmosphere, thereby achieving a heat radiating effect. In this figure, arrows indicate a flowing direction of the liquid refrigerant.

Next, a principle by which a gas (bubbles) is generated in the liquid refrigerant will be explained. In general, the solubility (a saturated solubility) of a gas in a liquid varies according to the temperature of the liquid. In the present embodiment, a case where a liquid whose solubility decreases as the temperature rises is used as the liquid refrigerant will be described for example.

The liquid refrigerant that has flowed into the heat absorber 2 is heated rapidly by the heat generated from the heat generator 6. This causes the solubility of the gas (i.e., the air) in the liquid refrigerant to drop sharply, and eventually the amount of dissolved gas exceeds the solubility. Consequently, the gas that has been dissolved in the refrigerant suddenly turns into bubbles. This is a mechanism of gas generation.

Furthermore, there are three crucial influences of the gas generation on the cooling device. First, owing to the gas generation, the flow channel in the heat absorber 2 is blocked, so that the liquid refrigerant cannot be circulated. Second, a layer of the gas is formed between the inner wall of the heat absorber 2 and the liquid refrigerant, thus lowering heat conductivity. Third, since not only the liquid refrigerant but also the generated gas flows into other devices, for example, the pump 1, the pump performance declines, thus deteriorating the cooling power.

Among the above, the most crucial problem is the first influence described above, that is, the flow channel in the heat absorber 2 is blocked, so that the liquid refrigerant cannot be circulated. This raises the temperature of the heat generator 6 such as a CPU, so that a circuit portion of portable equipment such as a notebook PC is likely to suffer from great damage.

In the process of generating the gas, first, the gas generated in the heat absorber 2 adheres to the inner wall of the heat absorber 2. The liquid refrigerant flowing into the heat absorber 2 is heated sequentially in the heat absorber 2, thus generating the gas further. Accordingly, the gas adhering to the inner wall grows. This substantially narrows a part of the flow channel of the heat absorber 2, so that a pressure loss of the flow channel increases greatly. In the cooling device mounted on the portable equipment such as a notebook PC, a miniature pump whose flow rate and head difference are relatively small is used as the pump 1. Therefore, such an increase in the pressure loss of the flow channel has a particularly large influence, so that the flow rate lowers considerably, making it impossible to circulate the liquid refrigerant.

In order to prevent such a problem, it is appropriate to regulate the amount (volume) of gas generated in the liquid refrigerant. In other words, the volume of the gas generated in the liquid refrigerant owing to a temperature change in the liquid refrigerant has to be smaller than the volume of a sphere that is inscribed in a cross-section of the flow channel forming the closed-loop circulating cycle. It is particularly preferable that the above-mentioned "cross-section" is a cross-section at a position where a cross-sectional area is minimal. When this condition is satisfied, the gas does not block the flow channel completely. Also, the pressure loss of the flow channel does not increase greatly. As a result, the flow rate of the liquid refrigerant can be secured.

The above-mentioned condition refers to the "sphere" because the gas is present as a sphere in the liquid refrigerant owing to a surface tension of the liquid refrigerant. Further, the "flow channel forming the closed-loop circulating cycle" includes not only the flow channel 4 in FIG. 1 but also the flow channels in the pump 1, the heat absorber 2 and the heat radiator 3. The reason why the above-mentioned condition refers to "is inscribed" in the flow channel is as follows. The gas that adheres to the inner wall of the flow channel grows first while maintaining its spherical shape. When the flow channel does not have a circular cross-sectional shape, the gas grows along a flowing direction of the liquid refrigerant after it grows to be inscribed in the flow channel. In this way, although the gas does not occupy the flow channel completely, it greatly reduces an effective cross-sectional area of the flow channel, so that the pressure loss of the flow channel increases considerably as in the case where the flow channel has a circular cross-sectional shape. Thus, it is more suitable to consider the relationship between the volume of the generated gas and "the volume of a sphere that is inscribed in a cross-section of the flow channel" rather than "the volume of a sphere whose projected area is equivalent to the cross-sectional area of the flow channel."

In the above-described condition, "the volume of the gas generated in the liquid refrigerant" is influenced by a condition of an atmosphere when the liquid refrigerant is sealed in the flow channel of the cooling device and a temperature change to which the liquid refrigerant is subjected during an operation of the cooling device thereafter.

Figure 5:
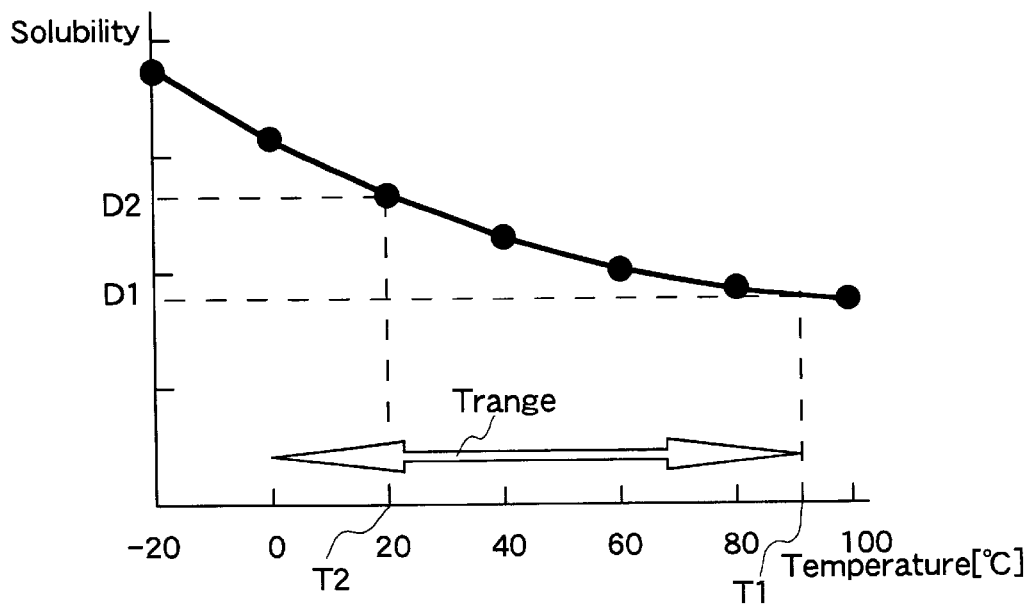
FIG. 5 is a graph schematically showing a solubility curve of the air with respect to the temperature of a liquid refrigerant used in the cooling device of the first embodiment of the present invention (downwardly-sloping characteristics).

Now, the following is an exemplary case where a liquid having solubility characteristics shown by a downwardly-sloping solubility curve of the gas (the air) in which a solubility decreases as the temperature rises as in FIG. 5 (such characteristics will be expressed as "the solubility changes negatively with respect to the temperature") is used as the liquid refrigerant. When the range of temperature change to which the liquid refrigerant is subjected inside the cooling device is expressed by an "operating temperature range Trange," a temperature at which the solubility is minimal within this temperature range (in the example of FIG. 5, an upper limit temperature within the operating temperature range, namely, the highest operating temperature) is expressed by T1, and the solubility of the air at the temperature T1 is expressed by D1. Further, the temperature at which the liquid refrigerant is sealed into the cooling device is expressed by T2, and the solubility of the air at the temperature T2 is expressed by D2. When a total capacity of the flow channel forming the closed-loop circulating cycle is expressed by V, the amount (volume) of gas Vair generated in the liquid refrigerant is calculated by Formula (1) below.

(1) $Vair = |D_1 - D_2| V$

The generated gas is present as a sphere in the liquid refrigerant owing to the surface tension of the liquid refrigerant. Therefore, the generated gas amount Vair and the area of the cross-section of the gas (circle) (namely, the projected area of the sphere) Sair have a relationship of Formula (2) below.

$$\left(\frac{3}{4} Vair\right)^2 = \frac{Sair^3}{\pi} \quad (2)$$

When the area of a circle that is inscribed in the flow channel at the position where the cross-sectional area of the flow channel in the cooling device is minimal is expressed by Schannel, the above condition can be given by Formula (3) below.

(3) $Sair < Schannel$

Alternatively, when the amount of gas dissolved in the liquid refrigerant in a state where no gas is generated is expressed by V0, the above condition also can be given by Formula (4) below.

(4) $V0 - VD_1 < Vchannel$ where Vchannel is the volume of the sphere that is inscribed in the flow channel at the position where the cross-sectional area of the flow channel in the cooling device is minimal. Vchannel and the above-mentioned area Schannel have a relationship of Formula (5) below.

$$\left(\frac{3}{4} Vchannel\right)^2 = \frac{Schannel^3}{\pi} \quad (5)$$

When Formula (3) or (4) is satisfied, the gas generated in the flow channel does not block the flow channel. Also, the pressure loss of the flow channel does not increase greatly. As a result, the flow rate of the liquid refrigerant can be secured.

Figure 6:
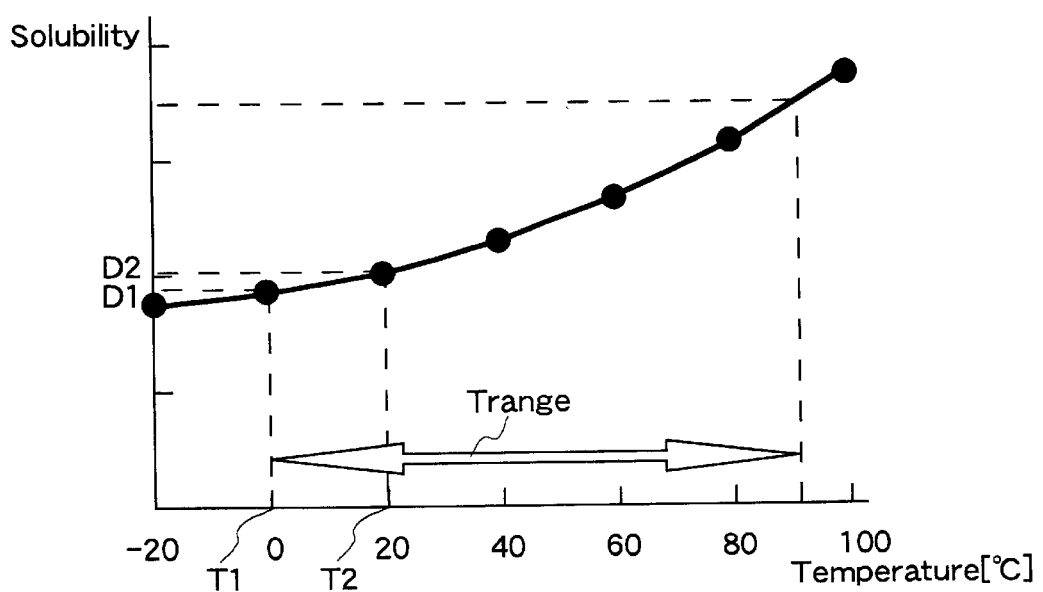
FIG. 6 is a graph schematically showing a solubility curve of the air with respect to the temperature of another liquid refrigerant used in the cooling device of the first embodiment of the present invention (upwardly-sloping characteristics).

FIG. 6 shows an upwardly-sloping solubility curve in which the air solubility increases as the temperature rises within the operating temperature range Trange (such characteristics will be expressed as "the solubility changes positively with respect to the temperature"). When using a liquid refrigerant having such solubility characteristics, it is appropriate to adopt the above-listed Formulae (1) to (5) by using the temperature T1 at which the solubility is minimal within the operating temperature range Trange (namely, the lowest operating temperature) and the solubility D1 of the air at the temperature T1, as shown by FIG. 6.

Figure 7:
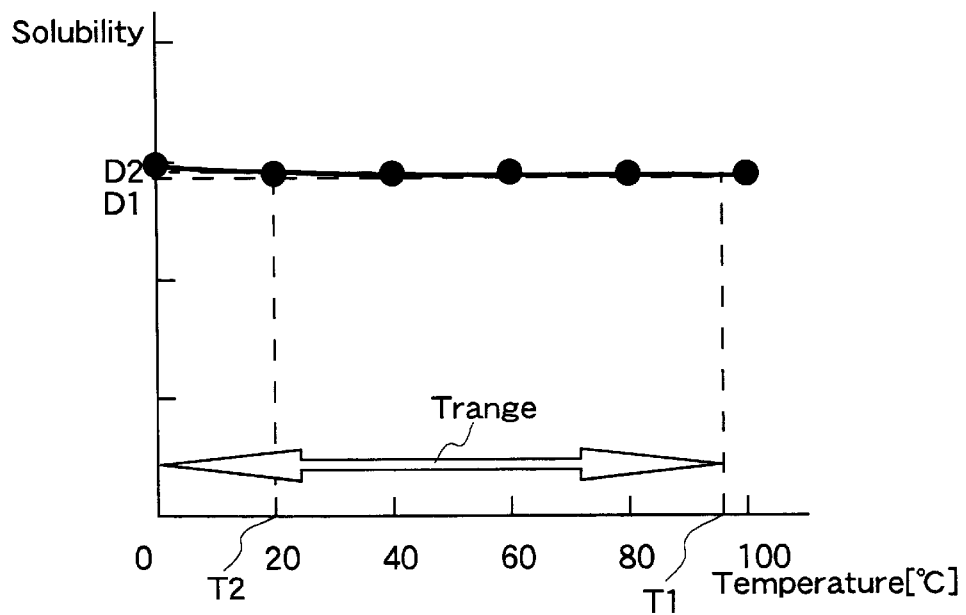
FIG. 7 is a graph schematically showing a solubility curve of the air with respect to the temperature of still another liquid refrigerant used in the cooling device of the first embodiment of the present invention (substantially horizontal characteristics).

FIG. 7 shows a solubility curve in which a decrease in the air solubility as the temperature rises within the operating temperature range Trange is so small that the curve can be considered substantially horizontal. When using a liquid refrigerant having such solubility characteristics, as in the case of FIG. 5, it is appropriate to adopt the above-listed Formulae (1) to (5) by using the temperature T1 at which the solubility is minimal within the operating temperature range Trange (namely, the highest operating temperature) and the solubility D1 of the air at the temperature T1. In the liquid refrigerant whose solubility curve is substantially horizontal, since D1≈D2, Formula (1) yields Vair≈0, and Formula (2) yields Sair≈0. Accordingly, Formula (3) results in Formula (6) below.

(6) $Sair << Schannel$

As becomes clear from the above, when such a liquid refrigerant is used, it is possible to achieve a cooling device in which the generation of the gas is extremely small and a high cooling effect can be obtained stably.

Figure 8:
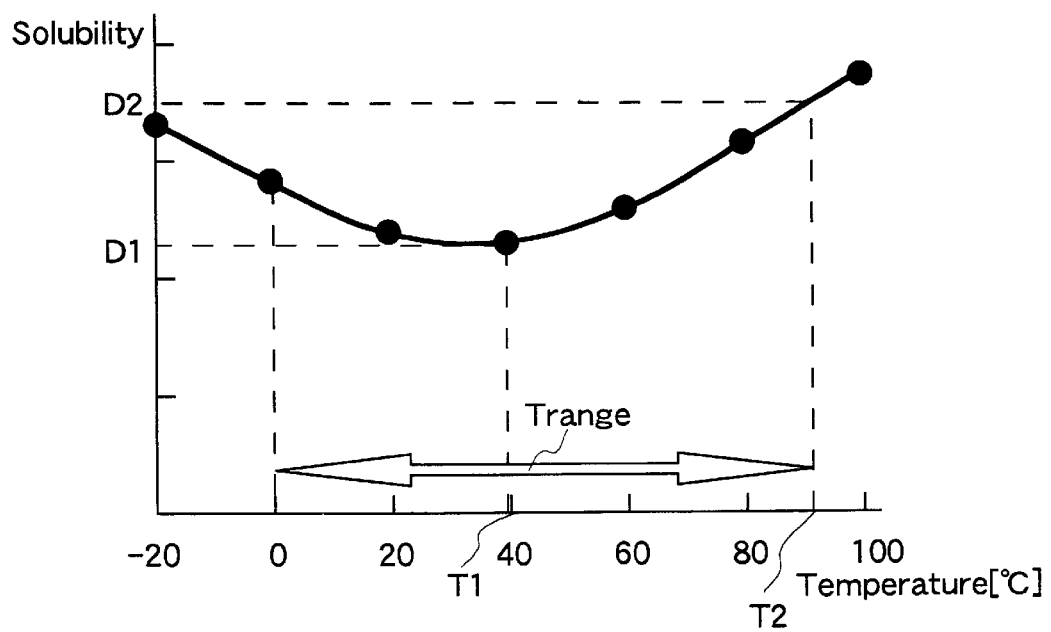
FIG. 8 is a graph schematically showing a solubility curve of the air with respect to the temperature of still another liquid refrigerant used in the cooling device of the first embodiment of the present invention (downwardly convex characteristics).

FIG. 8 shows a solubility curve of the air that is downwardly convex within the operating temperature range Trange. When using a liquid refrigerant having such solubility characteristics, as shown by FIG. 8, it is appropriate to adopt the above-listed Formulae (1) to (5) by using the temperature T1 at which the solubility is minimal within the operating temperature range Trange and the solubility D1 of the air at the temperature T1.

Furthermore, when using a liquid refrigerant having such solubility characteristics as indicated by a solubility curve of the air that is upwardly convex within the operating temperature range though not shown, it is appropriate to adopt the above-listed Formulae (1) to (5) by using the temperature T1 at which the solubility is minimal within the operating temperature range (namely, a temperature with smaller solubility out of the lowest operating temperature and the highest operating temperature) and the solubility D1 of the air at the temperature T1.

As described above, even when the solubility changes due to rapid heating or cooling of the liquid refrigerant, little gas is generated in the cooling device described in the present embodiment. Thus, it is possible to prevent the cooling power from deteriorating due to the deterioration in flow rate characteristics of the pump occurring because the gas generated after a long time use blocks the flow channel, the lowering heat conductivity caused by adhesion of the gas to the inner wall of the flow channel and the decline in the pump performance occurring because the generated gas flows into the pump.

In addition, since the gas in the present invention is the air containing usually nitrogen, oxygen, carbon dioxide etc., it is sufficient to consider the nitrogen and the oxygen that are major components when dealing with the solubility curve.

Various solubility characteristics of the liquid refrigerants described in the present embodiment may be achieved by using a single material as a liquid refrigerant or mixing a material whose solubility curve slopes downward and a material whose solubility curve slopes upward. For example, the material whose solubility curve slopes downward typically is water, hexane or methanol, and the material whose solubility curve slopes upward typically is acetone, octane, carbon tetrachloride or benzene. Moreover, not only two but also three of the above may be mixed. In those cases, needless to say, similar effects can be obtained by satisfying the above-mentioned condition.

In the present embodiment, the total capacity V of the flow channel refers to a capacity of an entire flow channel through which the liquid refrigerant circulates. Thus, capacities of the flow channel 24 of the heat absorber 2, the flow channel 31 of the heat radiator 3 and the space 20 of the pump 1 are included in the total capacity V.

In the cooling device of the present embodiment, elements other than the pump 1, the heat absorber 2 and the heat radiator 3 may be connected to the flow channel 4. For example, a tank that stores the liquid refrigerant may be connected to the flow channel 4 in order to adjust the amount of the liquid refrigerant appropriately. In this case, since the liquid refrigerant in the tank does not circulate, it is not heated or cooled. Accordingly, a capacity of this tank is not included in the above-described total capacity V of the flow channel.

Second Embodiment

The following is a description of a second embodiment of the present invention, with reference to the accompanying drawings.

Figure 9:
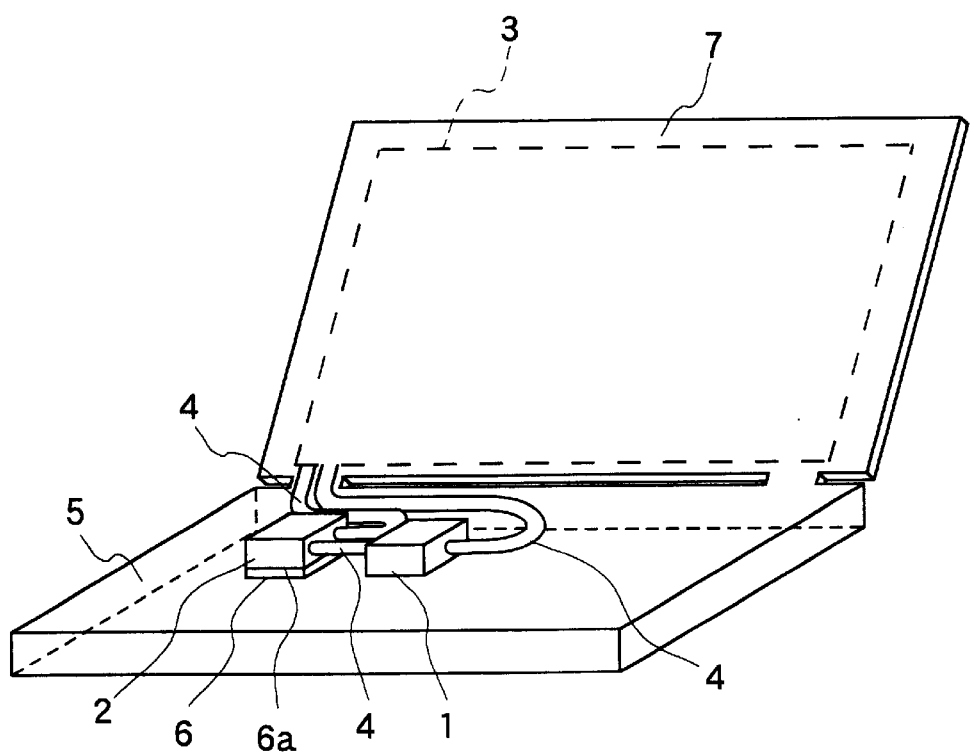
FIG. 9 is a schematic perspective view showing an example of a notebook PC in which a cooling device obtained by a method for manufacturing a cooling device in a second embodiment of the present invention is incorporated.
Figure 10:
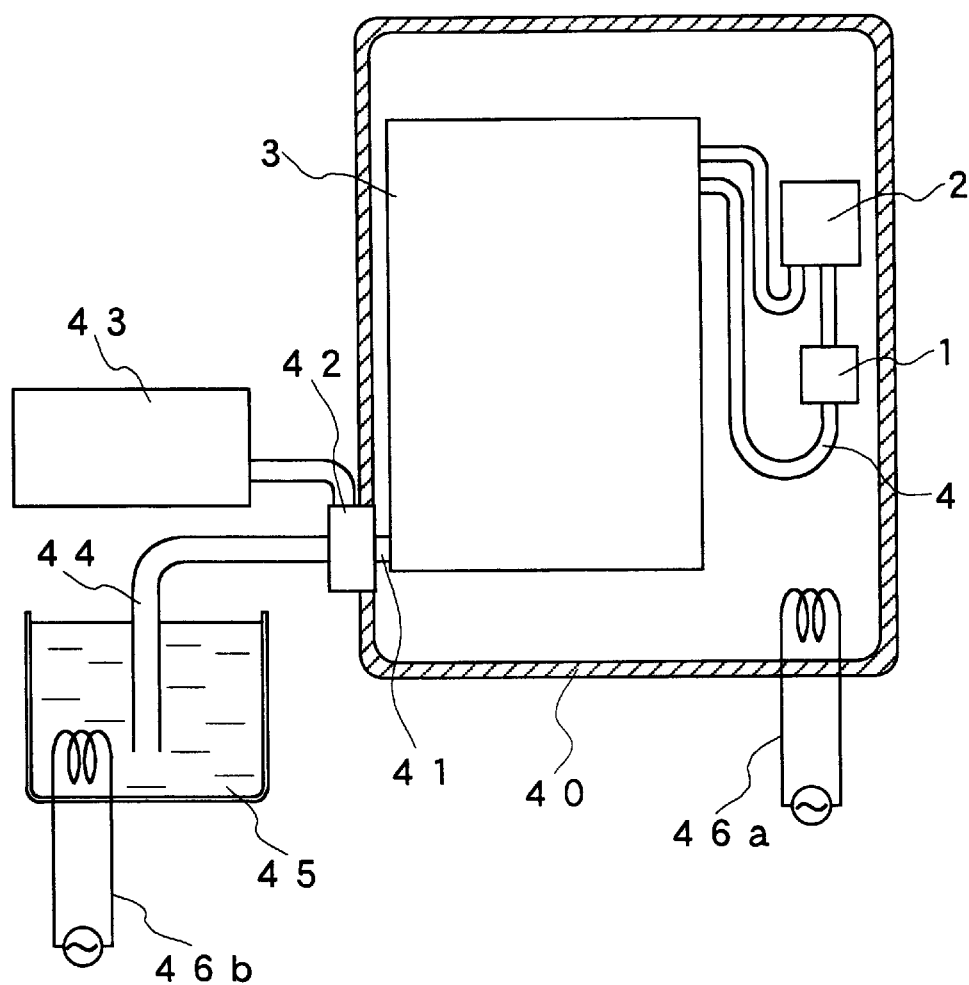
FIG. 10 is a schematic view showing an example of a sealing device used for sealing a liquid refrigerant into the cooling device in the method for manufacturing a cooling device according to the second embodiment of the present invention.
Figure 11:
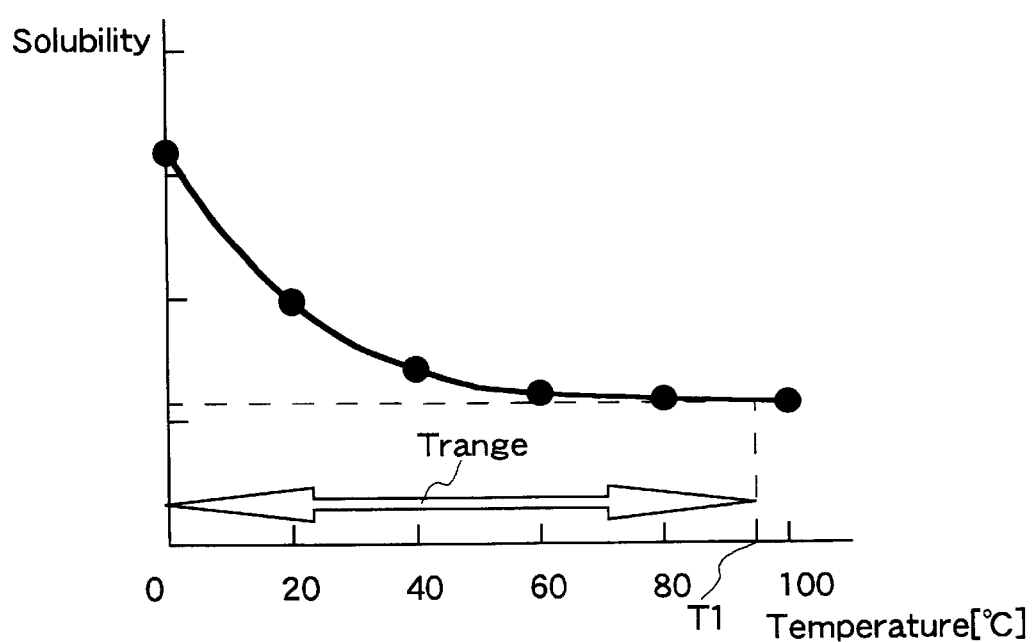
FIG. 11 is a graph schematically showing an example of downwardly-sloping solubility characteristics of the liquid refrigerant used in the cooling device in the method for manufacturing a cooling device according to the second embodiment of the present invention.

FIG. 9 is a schematic perspective view showing an example of a notebook PC in which a cooling device obtained by a method for manufacturing a cooling device in the second embodiment of the present invention is incorporated. FIG. 10 is a schematic view showing an example of a sealing device used for sealing a liquid refrigerant into the cooling device in the method for manufacturing a cooling device according to the second embodiment of the present invention. FIG. 11 is a graph schematically showing an example of the solubility characteristics of the liquid refrigerant used in the cooling device in the method for manufacturing a cooling device according to the second embodiment of the present invention.

In FIG. 9, numeral 1 denotes a pump, numeral 2 denotes a heat absorber, numeral 3 denotes a heat radiator, and numeral 4 denotes a flow channel that allows communication between the interiors of the pump 1, the heat absorber 2 and the heat radiator 3 and forms a closed-loop circulating cycle from the pump 1, the heat absorber 2, the heat radiator 3 to the pump 1. Numeral 5 denotes a housing of the notebook PC, numeral 6 denotes a heat generator such as a CPU, numeral 6a denotes a heat-transfer pad arranged between the heat generator 6 and the heat absorber 2, and numeral 7 denotes a display portion of the notebook PC. Inside the flow channel 4 forming the closed-loop circulating cycle from the pump 1, the heat absorber 2, the heat radiator 3 to the pump 1 is filled with a liquid refrigerant. The liquid refrigerant is out of contact with an outside air. The heat absorber 2 closely contacts the heat generator 6 such as the CPU via the heat-transfer pad 6a, whereby the heat from the heat generator 6 is transferred to the heat absorber 2 efficiently. The heat of the heat generator 6 is absorbed in the heat absorber 2 and further transmitted to the liquid refrigerant in the heat absorber 2. The heated liquid refrigerant is carried by the action of the pump 1, thereby carrying the heat to the heat radiator 3, which is formed on a back surface of the display portion 7, and exhausting the heat from the heat radiator 3 into the surrounding atmosphere. The resultant liquid refrigerant that has been cooled down is carried again to the heat absorber 2, and then the above-described operations are repeated.

Since the pump 1, the heat absorber 2 and the heat radiator 3 have structures similar to those described in the first embodiment, the description thereof will be omitted here.

The method of the present embodiment for sealing a liquid refrigerant into the cooling device of FIG. 9 constituted by the pump 1, the heat absorber 2, the heat radiator 3 and the flow channel 4 that allows communication therebetween will be described referring to FIG. 10.

In FIG. 10, numeral 40 denotes a container that encloses the cooling device in order to seal a liquid refrigerant, numeral 41 denotes a sealing port that is provided in, for example, the heat radiator 3 and introduces and seals a liquid refrigerant into the cooling device, and numeral 42 denotes a control valve-cum-sealer that passes a liquid refrigerant introduced by a differential pressure with respect to atmospheric pressure by decompressing the interior of the container 40 while decompressing the interior of the cooling device at the same time and, when the cooling device is filled with the liquid refrigerant, seals the sealing port 41 by heat or a similar effect. Numeral 43 denotes a decompressor for decompressing the interior of the container 40 and the cooling device, numeral 44 denotes a pipe for introducing a liquid refrigerant into the cooling device, and numeral 45 denotes a liquid refrigerant. Numeral 46a denotes a first heater for adjusting the temperature of an atmosphere inside the container 40, and numeral 46b denotes a second heater for adjusting the temperature of the liquid refrigerant 45. If necessary, the first heater 46a and/or the second heater 46b may be replaced by a cooler.

The following is a description of a method for manufacturing a cooling device using the liquid refrigerant sealing device with the above-described configuration. The cooling device disposed inside the container 40 is connected to the liquid refrigerant 45 via the sealing port 41, the control valve-cum-sealer 42 and the pipe 44. Since the liquid refrigerant 45 is under atmospheric pressure, it flows into and fills the cooling device when the interior of the container 40 and the cooling device are decompressed at the same time by the decompressor 43.

At this time, it is necessary to maintain the temperature of the atmosphere inside the cooling device and that of the liquid refrigerant 45 at a predetermined temperature in the present embodiment.

This will be described with an exemplary case in which the used liquid refrigerant has downwardly-sloping solubility characteristics as shown in FIG. 11. Within the operating temperature range Trange, the solubility of the gas (air) in this liquid refrigerant is minimal on a high temperature side of the operating temperature range Trange (namely, the highest operating temperature T1). Thus, the liquid refrigerant is sealed while maintaining the temperature inside the container 40 and that of the liquid refrigerant 45 at a temperature equal to or higher than this highest operating temperature T1. In this manner, even when the liquid refrigerant is heated rapidly inside the heat absorber 2 during an operation of the cooling device after the sealing, no air bubbles are generated because the amount of the air dissolved in the liquid refrigerant is smaller than the solubility at that temperature. Thus, it is possible to prevent the cooling power from deteriorating due to the deterioration in flow rate characteristics of the pump occurring because the gas generated after a long time use blocks the flow channel in the heat absorber, the lowering heat conductivity caused by adhesion of the gas to the inner wall of the flow channel in the heat absorber and the decline in the pump performance occurring because the generated gas flows into the pump.

Figure 12:
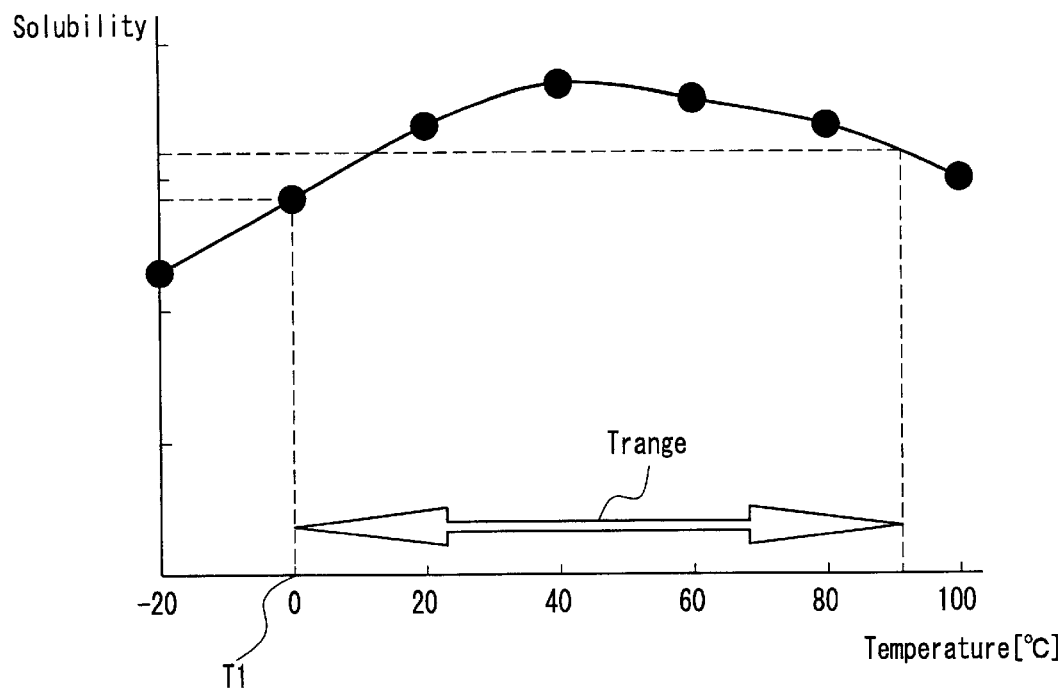
FIG. 12 is a graph schematically showing an example of upwardly-convex solubility characteristics of the liquid refrigerant used in the cooling device in the method for manufacturing a cooling device according to the second embodiment of the present invention.

The following is a description of a case in which the used liquid refrigerant has upwardly-convex solubility characteristics as shown in FIG. 12. Within the operating temperature range Trange, the solubility of the gas (air) in this liquid refrigerant is minimal on a high temperature side or a low temperature side of the operating temperature range Trange. Here, the description is directed to the case in which the solubility is minimal on the low temperature side (namely, the lowest operating temperature T1) within the operating temperature range Trange. The liquid refrigerant is sealed while maintaining the temperature inside the container 40 and that of the liquid refrigerant 45 at a temperature equal to or lower than this lowest operating temperature T1. In this manner, even when the liquid refrigerant is heated rapidly inside the heat absorber 2 or the liquid refrigerant is cooled inside the heat radiator 3 during the operation of the cooling device after the sealing, little air bubble is generated because the amount of the air dissolved in the liquid refrigerant is smaller than the solubility at that temperature. Thus, it is possible to prevent the cooling power from deteriorating due to the deterioration in flow rate characteristics of the pump occurring because the gas generated after a long time use blocks the flow channels in the heat absorber and the heat radiator, the lowering heat conductivity caused by adhesion of the gas to the inner walls of the flow channels in the heat absorber and the heat radiator and the decline in the pump performance occurring because the generated gas flows into the pump. Incidentally, in the case where the liquid refrigerant has upwardly-convex solubility characteristics and the air solubility is minimal on the high temperature side of the operating temperature range Trange, it is appropriate that the liquid refrigerant is sealed while maintaining the temperature inside the container 40 and that of the liquid refrigerant 45 at a temperature higher than this temperature on the higher side (the highest operating temperature T1).

Figure 13:
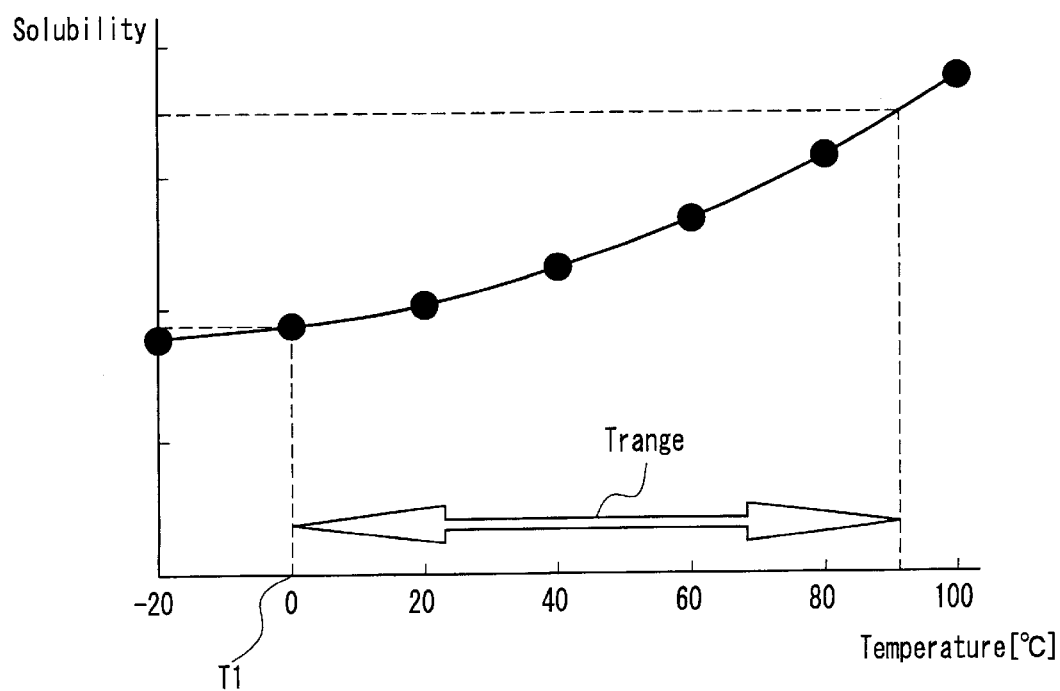
FIG. 13 is a graph schematically showing an example of upwardly-sloping solubility characteristics of the liquid refrigerant used in the cooling device in the method for manufacturing a cooling device according to the second embodiment of the present invention.

The following is a description of a case in which the used liquid refrigerant has upwardly-sloping solubility characteristics as shown in FIG. 13. Within the operating temperature range Trange, the solubility of the gas (air) in this liquid refrigerant is minimal on a low temperature side of the operating temperature range Trange (namely, the lowest operating temperature T1). The liquid refrigerant is sealed while maintaining the temperature inside the container 40 and that of the liquid refrigerant 45 at a temperature equal to or lower than this lowest operating temperature T1. In this manner, even when the liquid refrigerant is heated rapidly inside the heat absorber 2 or the liquid refrigerant is cooled inside the heat radiator 3 during the operation of the cooling device after the sealing, little air bubble is generated because the amount of the air dissolved in the liquid refrigerant is smaller than the solubility at that temperature. Thus, it is possible to prevent the cooling power from deteriorating due to the deterioration in flow rate characteristics of the pump occurring because the gas generated after a long time use blocks the flow channels in the heat absorber and the heat radiator, the lowering heat conductivity caused by adhesion of the gas to the inner walls of the flow channels in the heat absorber and the heat radiator and the decline in the pump performance occurring because the generated gas flows into the pump.

Figure 14:
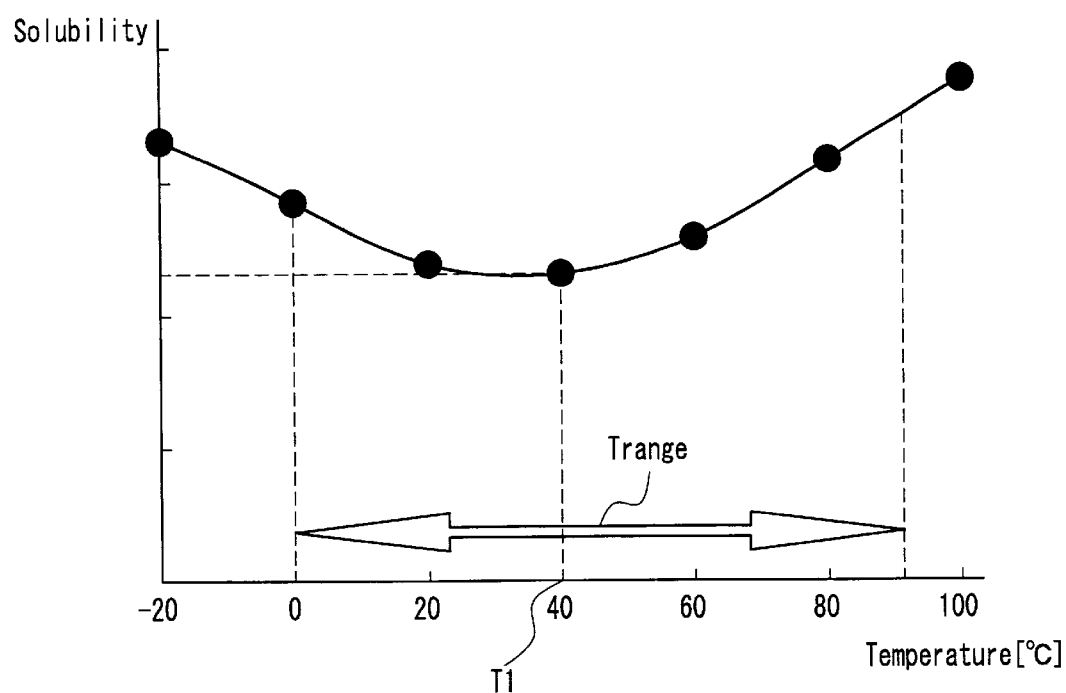
FIG. 14 is a graph schematically showing an example of downwardly-convex solubility characteristics of the liquid refrigerant used in the cooling device in the method for manufacturing a cooling device according to the second embodiment of the present invention.

The following is a description of a case in which the used liquid refrigerant has downwardly-convex solubility characteristics as shown in FIG. 14. Within the operating temperature range Trange, the solubility of the gas (air) in this liquid refrigerant is minimal at a temperature T1 between the high temperature side and the low temperature side of the operating temperature range Trange. The liquid refrigerant is sealed while maintaining the temperature inside the container 40 and that of the liquid refrigerant 45 at this temperature T1. In this manner, even when the liquid refrigerant is heated rapidly inside the heat absorber 2 or the liquid refrigerant is cooled inside the heat radiator 3 during the operation of the cooling device after the sealing, little air bubble is generated because the amount of the air dissolved in the liquid refrigerant is smaller than the solubility at that temperature. Thus, it is possible to prevent the cooling power from deteriorating due to the deterioration in flow rate characteristics of the pump occurring because the gas generated after a long time use blocks the flow channels in the heat absorber and the heat radiator, the lowering heat conductivity caused by adhesion of the gas to the inner walls of the flow channels in the heat absorber and the heat radiator and the decline in the pump performance occurring because the generated gas flows into the pump.

The above description has been directed to the cases of using the liquid refrigerants having downwardly-sloping, upwardly-convex, upwardly-sloping and downwardly-convex solubility curves of the air, respectively. As described above, the present embodiment is applicable to any cases of downwardly-sloping, upwardly-convex, upwardly-sloping and downwardly-convex solubility curves. It is possible to obtain the above-mentioned effects by setting the temperature of the atmosphere at the time of sealing the liquid refrigerant to a temperature at which the solubility is minimal within the operating temperature range Trange when the solubility curve is downwardly convex within the operating temperature range Trange of the liquid refrigerant and to a temperature at which the solubility is smaller than the minimal value of the solubility within the operating temperature range Trange (usually, this temperature is outside the operating temperature range Trange) when the solubility curve slopes downward, is upwardly convex or slopes upward within the operating temperature range Trange of the liquid refrigerant.

Third Embodiment

The following is a description of a third embodiment of the present invention, with reference to the accompanying drawings.

Figure 15:
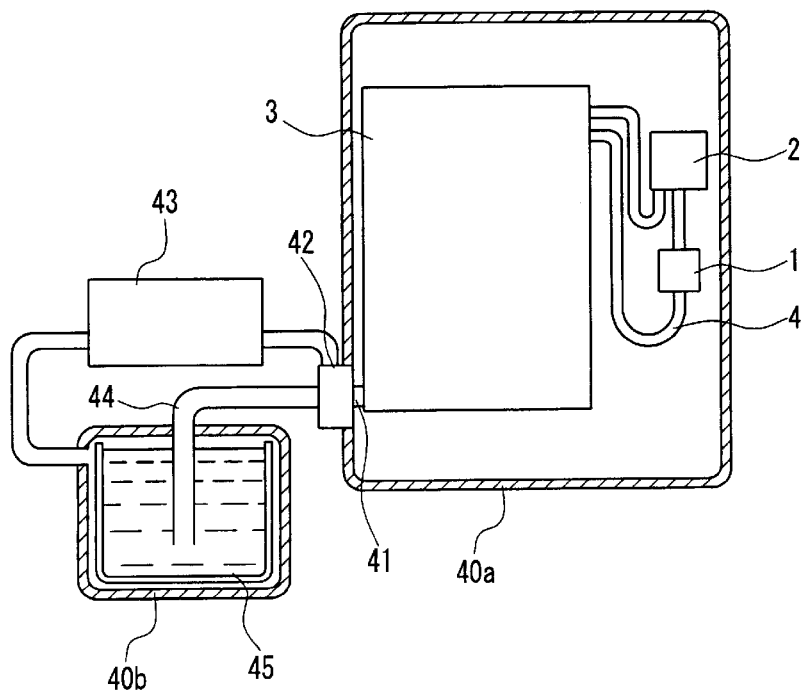
FIG. 15 is a schematic view showing an example of a sealing device used for sealing a liquid refrigerant into a cooling device in a method for manufacturing a cooling device according to a third embodiment of the present invention.
Figure 16:
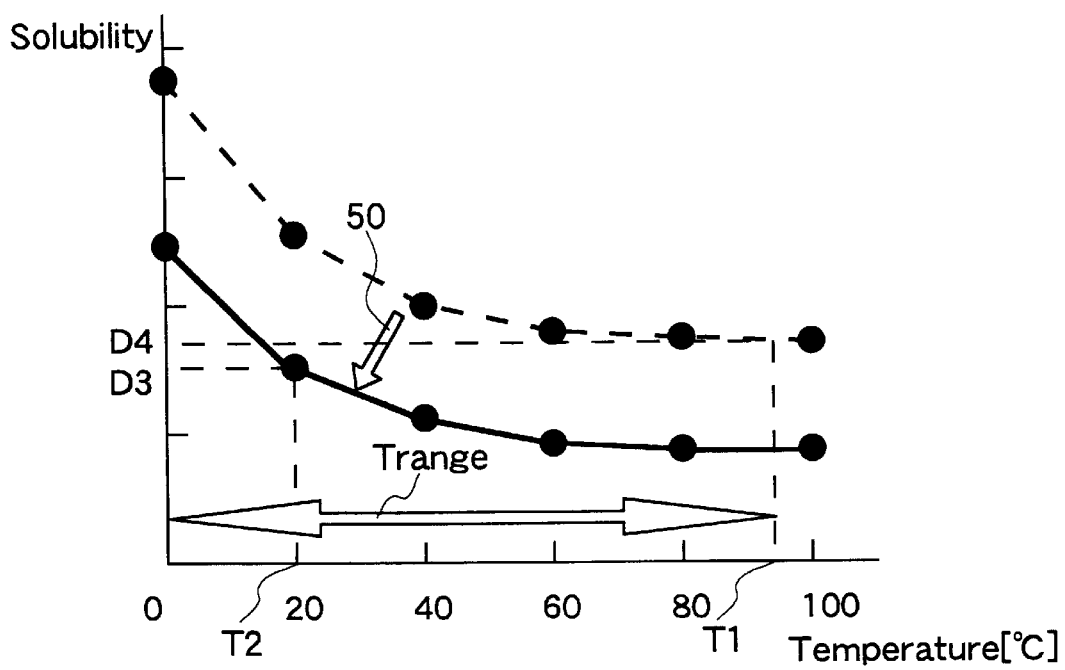
FIG. 16 is a graph schematically showing an example of solubility characteristics of the liquid refrigerant used in the cooling device in the method for manufacturing a cooling device according to the third embodiment of the present invention.
Figure 17:
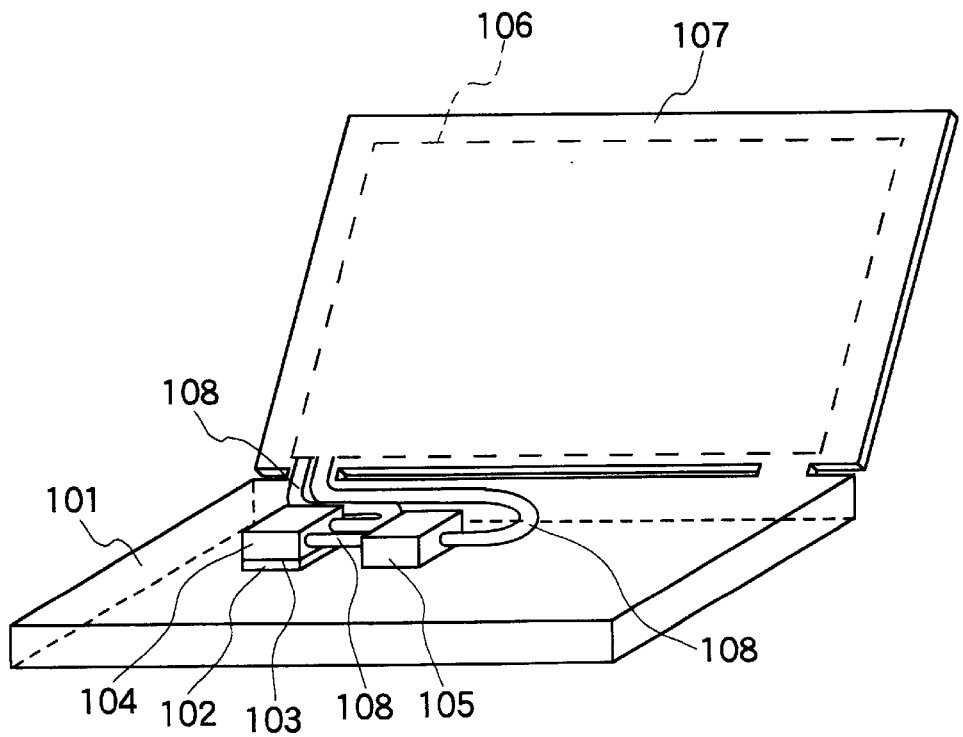
FIG. 17 is a schematic perspective view showing a notebook PC in which a conventional cooling device is incorporated.

FIG. 15 is a schematic view showing an example of a sealing device used for sealing a liquid refrigerant into a cooling device in a method for manufacturing a cooling device according to the third embodiment of the present invention. FIG. 16 is a graph schematically showing an example of solubility characteristics of the liquid refrigerant used in the cooling device in the method for manufacturing a cooling device according to the third embodiment of the present invention.

Since the cooling device and a notebook PC in which this cooling device is incorporated in the present embodiment have schematic configurations similar to those described in the second embodiment, the description thereof will be omitted here.

The method of the present embodiment for sealing the liquid refrigerant into the cooling device constituted by the pump 1, the heat absorber 2, the heat radiator 3 and the flow channel 4 that allows communication therebetween will be described referring to FIG. 15.

In FIG. 15, numeral 40*a* denotes a first container that encloses the cooling device in order to seal a liquid refrigerant, numeral 40*b* denotes a second container that encloses a liquid refrigerant, numeral 41 denotes a sealing port that is provided in, for example, the heat radiator 3 and introduces and seals a liquid refrigerant into the cooling device, and numeral 42 denotes a control valve-cum-sealer that passes a liquid refrigerant introduced by a differential pressure with respect to atmospheric pressure by decompressing the interior of the first container 40*a* while decompressing the interior of the cooling device at the same time and, when the cooling device is filled with the liquid refrigerant, seals the sealing port 41 with heat or a similar effect. Numeral 43 denotes a decompressor for decompressing the interior of the first container 40*a*, the second container 40*b* and the cooling device independently at a predetermined pressure, numeral 44 denotes a pipe for introducing the liquid refrigerant into the cooling device, and numeral 45 denotes a liquid refrigerant.

The following is a description of a method for manufacturing the cooling device using the liquid refrigerant sealing device with the above-described configuration. The cooling device disposed inside the first container 40*a* is connected to the liquid refrigerant 45 via the sealing port 41, the control valve-cum-sealer 42 and the pipe 44. The decompressor 43 is used to decompress and control individually the interior of the first container 40*a*, the cooling device and the second container 40*b* at the same time. The pressure inside the first container 40*a* and the pressure inside the cooling device are set lower than the pressure inside the second container 40*b*, whereby the liquid refrigerant 45 flows into and fills the cooling device.

At this time, it is necessary to set the pressure inside the second container 40*b* at a pressure equal to or lower than a predetermined pressure in the present embodiment.

This will be described with an exemplary case in which the used liquid refrigerant has downwardly-sloping solubility characteristics as shown in FIG. 16. In FIG. 16, a dotted line indicates a solubility curve under atmospheric pressure, whereas a solid line indicates a solubility curve under an atmosphere that is decompressed to lower than the atmospheric pressure. Many liquids have a solubility that lowers with a decrease in the pressure of an atmosphere as shown in FIG. 16 (in other words, as the pressure of the atmosphere lowers, the solubility curve shifts in a direction indicated by an arrow 50 in FIG. 16). The solubility of the gas (air) in this liquid refrigerant is minimal on a high temperature side of the operating temperature range Trange (namely, the highest operating temperature T1). Under atmospheric pressure, at the highest operating temperature T1, the solubility reaches a minimal value of D4 within the operating temperature range Trange. As the interior of the second container 40*b* is decompressed more and more (in other words, the solubility curve is shifted in the arrow 50 direction in FIG. 16), a solubility D3 at a temperature T2 of the atmosphere at the time of sealing the liquid refrigerant eventually reaches a point below the above-mentioned minimal value D4 of the solubility within the operating temperature range Trange under atmospheric pressure (D3<D4). In the present embodiment, the liquid refrigerant is sealed in the cooling device while decompressing the interior of the second container 40*b* so that D3<D4 is satisfied. In this manner, the amount of gas dissolved in the liquid refrigerant at the time of sealing can be set much smaller than the minimal solubility D4 within the operating temperature range Trange of the liquid refrigerant during an operation of the cooling device. Therefore, even when the liquid refrigerant is heated rapidly inside the heat absorber 2 during the operation of the cooling device after the sealing, little air bubble is generated because the amount of the air dissolved in the liquid refrigerant is smaller than the solubility at that temperature. Thus, it is possible to prevent the cooling power from deteriorating due to the deterioration in flow rate characteristics of the pump occurring because the gas generated after a long time use blocks the flow channel in the heat absorber, the lowering heat conductivity caused by adhesion of the gas to the inner wall of the heat absorber and the decline in the pump performance occurring because the generated gas flows into the pump.

Furthermore, in addition to the decompressing process of the present embodiment at the time of sealing the liquid refrigerant, the interior of the first container 40*a* and the liquid refrigerant 45 may be heated or cooled as described in the second embodiment, thereby obtaining effects similar to those described in the second and third embodiments.

Although the above description has been directed to the case of using the liquid refrigerant whose solubility curve of the air slopes downward, the present embodiment is not limited to the above. For example, the solubility curve also may slope upward, be downwardly convex or upwardly convex. In any cases, the liquid refrigerant is sealed under an atmosphere decompressed so that the solubility at the temperature of the atmosphere at the time of sealing the liquid refrigerant is smaller than the minimal value of the solubility under atmospheric pressure within the operating temperature range of the liquid refrigerant, thereby obtaining effects similar to the above.

Although the notebook personal computer has been illustrated as portable equipment in the first to third embodiments described above, there is no particular limitation to this. The portable equipment also may be a miniature easily-portable electronic device such as a PDA (personal digital assistance) or a cellular phone.

Although the CPU has been illustrated as an object to be cooled down to which the heat absorber 2 is attached in the first to third embodiments described above, the present invention is not limited to this but can be applied, for example, to a cooling device of a semiconductor element.

Additionally, in the first to third embodiments described above, the "operating temperature range" of the liquid refrigerant refers to a range of temperature change to which the liquid refrigerant actually is subjected (or designed temperature change to which the liquid refrigerant is expected to be subjected) when the liquid refrigerant circulates in the flow channel inside the cooling device. The upper limit of this "operating temperature range" mostly varies according to a temperature of heat generated from the heat generator 6 that the heat absorber 2 closely contacts. The lower limit thereof generally coincides with the temperature of the liquid refrigerant after being cooled down by the heat radiator 3. When the cooling device is used for a notebook PC, in general, the upper limit of the operating temperature range of the liquid refrigerant is 95° C. or 65° C., whereas the lower limit thereof is 0° C. It is needless to say, however, that the operating temperature range of the liquid refrigerant in the present invention is not limited to the above.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A cooling device comprising:
    a pump;
    a heat absorber;
    a heat radiator;
    a flow channel that allows communication between interiors of the pump, the heat absorber and the heat radiator and forms a closed-loop circulating cycle therebetween; and
    a liquid refrigerant that circulates in the flow channel;
    wherein a volume of a gas generated in the liquid refrigerant owing to temperature change within an operating temperature range of the liquid refrigerant is smaller than a volume of a sphere that is inscribed in a cross-section of the flow channel.

2. The cooling device according to claim 1, wherein the liquid refrigerant is a mixture of a material whose gas solubility changes positively with respect to a temperature and a material whose gas solubility changes negatively with respect to a temperature.

3. A portable piece of equipment comprising the cooling device according to claim 1.

4. A cooling device comprising:
    a pump;
    a heat absorber;
    a heat radiator;
    a flow channel that allows communication between interiors of the pump, the heat absorber and the heat radiator and forms a closed-loop circulating cycle therebetween; and
    a liquid refrigerant that circulates in the flow channel;
    wherein a difference between a product and an amount of a gas dissolved in the liquid refrigerant in a state where no gas is generated is smaller than a volume of a sphere that is inscribed in a minimal cross-section of the flow channel, the product being a product of a minimal solubility of the gas in the liquid refrigerant within an operating temperature range of the liquid refrigerant and a total capacity of the flow channel.

5. The cooling device according to claim 4, wherein the liquid refrigerant a mixture of a material whose gas solubility changes positively with respect to a temperature and a material whose gas solubility changes negatively with respect to a temperature.

6. A portable piece of equipment comprising the cooling device according to claim 4.

7. A method for manufacturing a cooling device comprising a pump, a heat absorber, a heat radiator, a flow channel that allows communication between interiors of the pump, the heat absorber and the heat radiator and forms a closed-loop circulating cycle therebetween, and a liquid refrigerant that circulates in the flow channel; the method comprising:
    sealing the liquid refrigerant in the flow channel while maintaining an atmosphere at a temperature at which a gas solubility in the liquid refrigerant takes on a minimal value within an operating temperature range of the liquid refrigerant or is smaller than the minimal value.

8. The method for manufacturing a cooling device according to claim 7, wherein the liquid refrigerant is sealed in the flow channel while maintaining the atmosphere at a temperature equal to or higher than the temperature at which the gas solubility in the liquid refrigerant takes on the minimal value within the operating temperature range of the liquid refrigerant.

9. The method for manufacturing a cooling device according to claim 7, wherein the liquid refrigerant is sealed in the flow channel under a decompressed atmosphere.

10. A method for manufacturing a cooling device comprising a pump, a heat absorber, a heat radiator, a flow channel that allows communication between interiors of the pump, the heat absorber and the heat radiator and forms a closed-loop circulating cycle therebetween, and a liquid refrigerant that circulates in the flow channel; the method comprising:
    sealing the liquid refrigerant in the flow channel under an atmosphere decompressed so that a gas solubility in the liquid refrigerant at a temperature of an atmosphere at the time of sealing the liquid refrigerant in the flow channel is smaller than a minimal value of the gas solubility under an atmospheric pressure within an operating temperature range of the liquid refrigerant.

* * * * *

UNITED STATES PATENT AND TRADEMARK OFFICE
CERTIFICATE OF CORRECTION

PATENT NO. : 6,748,758 B2
DATED : June 15, 2004
INVENTOR(S) : Imada et al.

It is certified that error appears in the above-identified patent and that said Letters Patent is hereby corrected as shown below:

Title page,
Item [54], Title, "COOLING DEVICE, METHOD OF" should read -- COOLING DEVICE, METHOD FOR --.

Column 16,
Line 10, "liquid refrigerant a mixture" should read -- liquid refrigerant is a mixture --.

Signed and Sealed this

Eighteenth Day of October, 2005

JON W. DUDAS
*Director of the United States Patent and Trademark Office*